US009355944B1

(12) United States Patent
Liu et al.

(10) Patent No.: US 9,355,944 B1
(45) Date of Patent: May 31, 2016

(54) SEMICONDUCTOR DEVICE AND LEAD FRAME HAVING VERTICAL CONNECTION BARS

(71) Applicants: Peng Liu, Tianjin (CN); Qingchun He, Tianjin (CN); Ping Wu, Tianjin (CN)

(72) Inventors: Peng Liu, Tianjin (CN); Qingchun He, Tianjin (CN); Ping Wu, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/677,964

(22) Filed: Apr. 2, 2015

(30) Foreign Application Priority Data

Nov. 18, 2014 (CN) .......................... 2014 1 0858172

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC ...... *H01L 23/49551* (2013.01); *H01L 21/4825* (2013.01); *H01L 21/4842* (2013.01); *H01L 21/565* (2013.01); *H01L 23/3114* (2013.01); *H01L 23/4952* (2013.01)

(58) Field of Classification Search
CPC ........... H01L 2224/48247; H01L 2224/73265; H01L 2924/181; H01L 2224/48091; H01L 2224/49171; H01L 23/49541; H01L 24/48; H01L 2224/48257; H01L 2224/48227; H01L 24/45; H01L 24/49; H01L 2224/85
See application file for complete search history.

(56) References Cited

U.S. PATENT DOCUMENTS

| | | | |
|---|---|---|---|
| 7,049,177 B1 | 5/2006 | Fan | |
| 8,377,750 B2 | 2/2013 | Camacho et al. | |
| 8,575,732 B2 | 11/2013 | Sirinorakul | |
| 8,575,762 B2 | 11/2013 | Nondhasitthichai et al. | |
| 8,785,253 B2 | 7/2014 | Li | |
| 2006/0234426 A1* | 10/2006 | Lau | H01L 21/565 438/127 |
| 2009/0166821 A1* | 7/2009 | Camacho | H01L 23/3121 257/667 |

* cited by examiner

*Primary Examiner* — Khiem D Nguyen
(74) *Attorney, Agent, or Firm* — Charles E. Bergere

(57) ABSTRACT

A semiconductor device includes a lead frame having a die support area and a plurality of inner and outer row leads surrounding the die support area, and a semiconductor die mounted on the die support area and electrically connected to the leads with bond wires. A molding material encapsulates the semiconductor die, the bond wires, and the leads, and defines a package body. The semiconductor device further includes connection bars extending vertically from the leads to a top surface of the package body. The connection bars connect the inner row leads to respective ones of the outer row leads before the molding process is performed.

11 Claims, 13 Drawing Sheets

US 9,355,944 B1

SEMICONDUCTOR DEVICE AND LEAD FRAME HAVING VERTICAL CONNECTION BARS

BACKGROUND OF THE INVENTION

The present invention relates to integrated circuit (IC) device assembly and, more particularly, to lead frames for semiconductor packages.

Many current quad-flat no-leads (QFN) packages include more than one row of leads to increase the number of inputs and outputs (I/Os) of the packages while maintaining the package size. FIG. 1 is an isometric view showing a bottom surface of a conventional QFN package 100. The QFN package 100 is assembled using a lead frame 102 including first and second rows of leads 104 and 106 surrounding a flag 108. A die (not shown) is mounted on the flag 106 and electrically connected to the first and second rows of leads 104 and 106. Then the die and the lead frame 102 are encapsulated by a molding compound 110.

FIG. 2 shows a cross sectional view of the QFN package 100 after encapsulation. A die 112 is mounted on the flag 108 and electrically connected to the first and second rows of leads 104 and 106 with bond wires 114. In a conventional method, the lead frame 102 is provided having the second row of leads 106 connected to the first row of leads 104. Therefore, after the molding or encapsulation process, an additional half-cutting of the bottom side of the QFN package 100 with a blade 116 must be performed to disconnect the second row of leads 106 from the first row of leads 104. Further, selective plating on the cutting sides 118 of the first and second row of leads is also required. Accordingly, it would be advantageous to have an alternative way to assemble a QFN package having multiple rows of leads.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
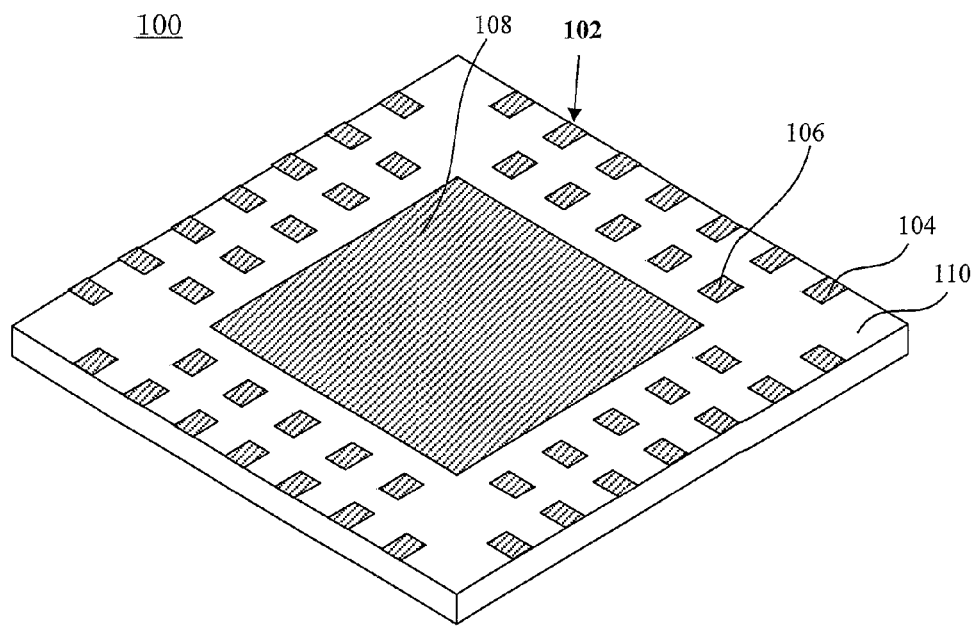
FIG. 1 is an isometric view showing a bottom surface of a conventional QFN package with two rows of leads.
Figure 2:
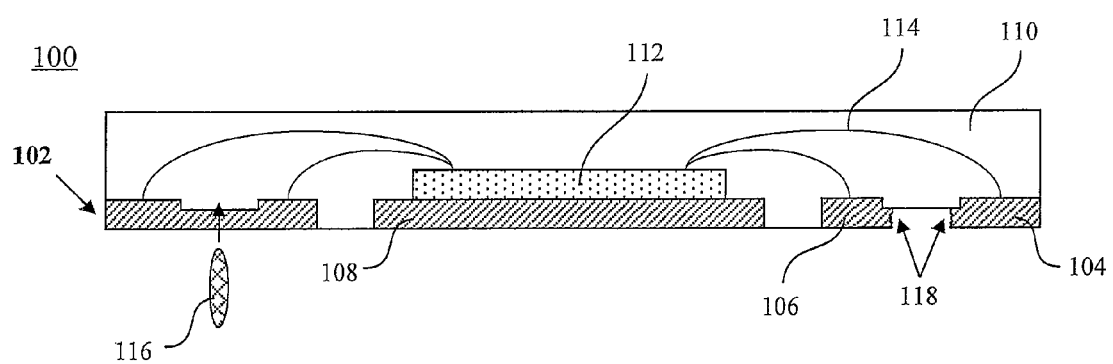
FIG. 2 shows a cross-sectional view of the conventional QFN package of in FIG. 1 after a molding process.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor device including a lead frame having a die support area and at least inner and outer rows of leads surrounding the die support area. A semiconductor die is mounted on the die support area and electrically connected to the two rows of leads with bond wires. A molding material covers the semiconductor die, the bond wires and the two rows of leads. The molding material defines a package body with the two rows of leads being exposed on a bottom surface of the package body. The semiconductor device further includes inner connection bars connected to the inner leads. The inner connection bars extend vertically from the inner row leads to a top surface of the package body. The inner connection bars are connected to respective ones of the outer row leads before the molding material is provided to encapsulate the semiconductor die, the bond wires and the two rows of leads.

In another embodiment, the present invention provides a lead frame including a die support area for supporting a semiconductor die, and at least two rows of leads surrounding the die support area. The two rows of leads include inner row leads and outer row leads, and a connection bar connecting each of the inner row leads to a respective one of the outer row leads. The connection bar is bendable to a vertical position.

In yet another embodiment, the present invention provides a method for packaging a semiconductor device. The method includes providing a lead frame having a die support area, at least two rows of leads surrounding the die support area, and a plurality of connection bars, where the two rows of leads include inner row leads and outer row leads. The inner row leads are connected to the outer row leads with the connection bars. The method further includes bending the connection bars to a vertical position, attaching a semiconductor die to the die support area, electrically connecting the die to the two rows of leads with bond wires, encapsulating the die, bond wires and two rows of leads with a molding material to form a molded package body, and removing a top portion of the molded package body, where the connection bars are cut such that the inner row leads are no longer connected to the outer row leads.

Figure 3:
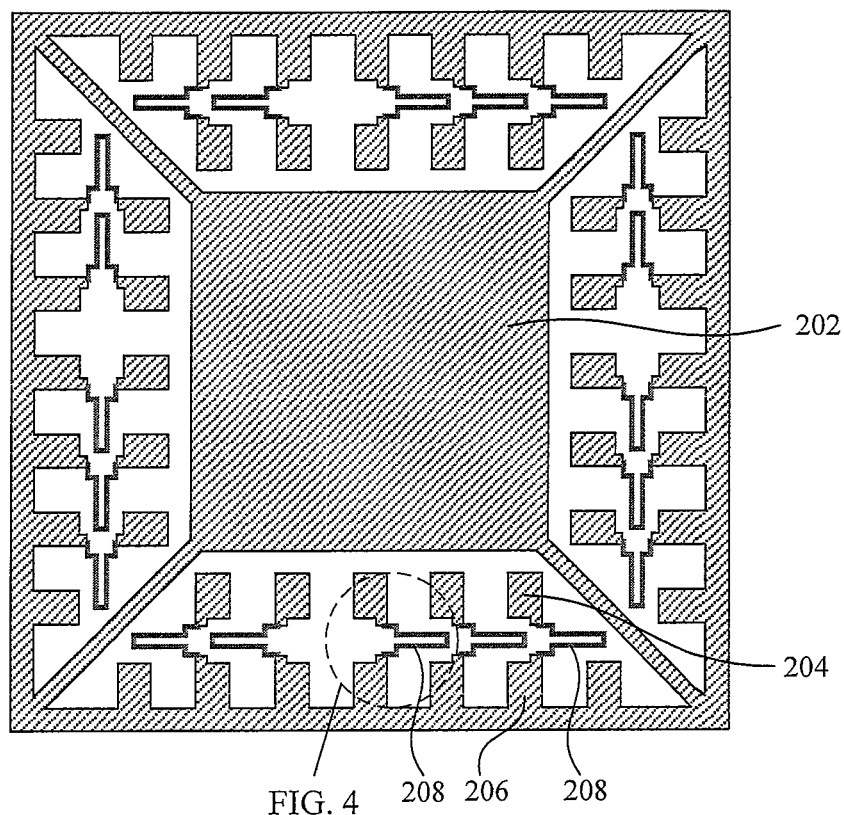
FIG. 3 is a schematic top plan view of a lead frame in accordance with an embodiment of the present invention.

Referring now to FIG. 3, a schematic top plan view of a lead frame 200 in accordance with an embodiment of the present invention is shown. The lead frame 200 includes a die support area 202 for supporting a semiconductor die (not shown), and at least two rows of leads surrounding the die support area 202. The two rows of leads include a plurality of inner row leads 204 and a plurality of outer row leads 206. The lead frame 200 further includes connection bars 208 that connect each of the inner row leads 204 to respective ones of the outer row leads 206. The connection bar 208 is bendable from a horizontal position to a vertical or almost vertical position. The lead frame 200 is preferably formed from a piece of metal sheet (e.g., copper sheet) by stamping or etching.

Figure 4:
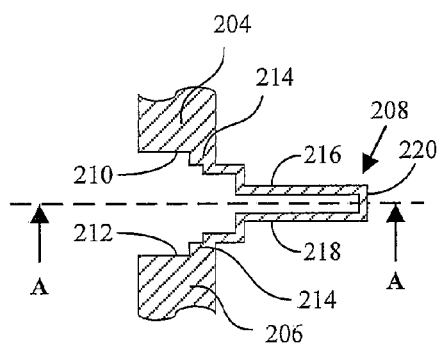
FIG. 4 is an enlarged schematic top plan view of a connection bar of the lead frame illustrated in FIG. 3 in accordance with an embodiment of the present invention.

FIG. 4 shows an enlarged schematic top plan view of the connection bar 208 of the lead frame 200 illustrated in FIG. 3 in accordance with an embodiment of the present invention. In a preferred embodiment, each lead has a proximal end and an opposing distal end, and the connection bar 208 extends from the distal end 210 of each inner row lead 204 to the proximal end 212 of each outer row lead 206. Each lead further includes two sides opposite to each other and adjacent to the proximal and distal ends. The connection bar 208 is preferably offset to one of the two sides. In a preferred embodiment, each lead includes a protrusion part 214 at the distal end 210 of each inner row lead 204 or the proximal end 212 of each outer row lead 212, where the connection bar 208 extends from the protrusion part 214.

In a preferred embodiment, the connection bar 208 includes an inner portion 216 extending from the inner row lead 204, and an outer portion 218 extending from the outer row lead 206. The inner portion 216 and the outer portion 218 are parallel to each other and connected by a connection portion 220.

Figure 5:
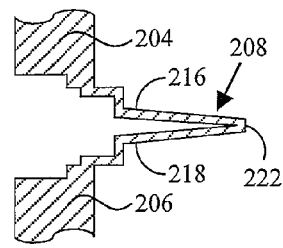
FIGS. 5 and 6 are enlarged schematic top plan views of a connection bar in accordance with other embodiments of the present invention.
Figure 6:
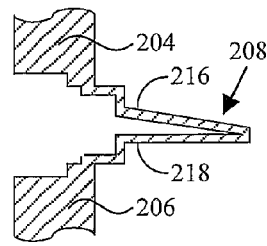

FIGS. 5 and 6 are enlarged schematic top plan views of the connection bar 208 in accordance with other embodiments of the present invention. In a preferred embodiment, the inner portion 216 and the outer portion 218 intersect at a distal end 222. In a preferred embodiment, as shown in FIG. 6, one of the inner and outer portions 216 and 218 is parallel to one side of the lead frame 200.

Figure 7:
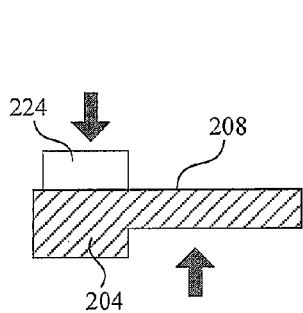
FIGS. 7-9 are cross-sectional views of the connection bar from the line A-A of FIG. 4 illustrating the steps in forming vertical connection bars in accordance with an embodiment of the present invention.
Figure 8:
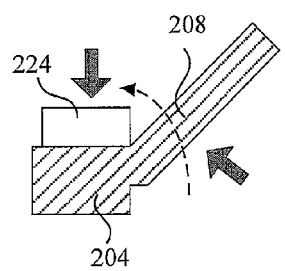
Figure 9:
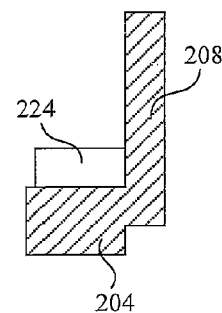

FIGS. 7-9 are cross-sectional views of the connection bar from the line A-A of FIG. 4 illustrating the steps in forming vertical connection bars in accordance with an embodiment of the present invention. Starting from FIG. 7, a fix block 224 is placed on the inner and outer row leads 204 and 206 to help bend the connection bar 208. In the next step, illustrated in FIG. 8, the connection bar 208 is pushed from a bottom side of the lead frame 200 and bent to a vertical position (shown in FIG. 9).

Figure 10:
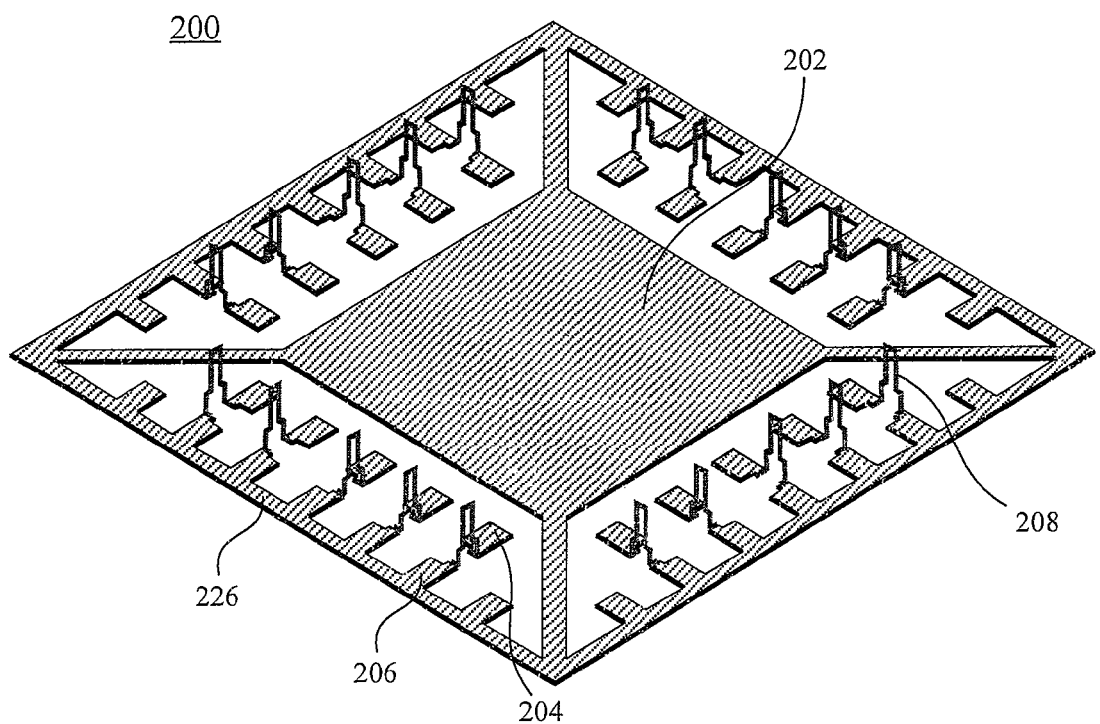
FIG. 10 is an isometric view of a lead frame with vertical connection bars in accordance with an embodiment of the present invention.
Figure 11:
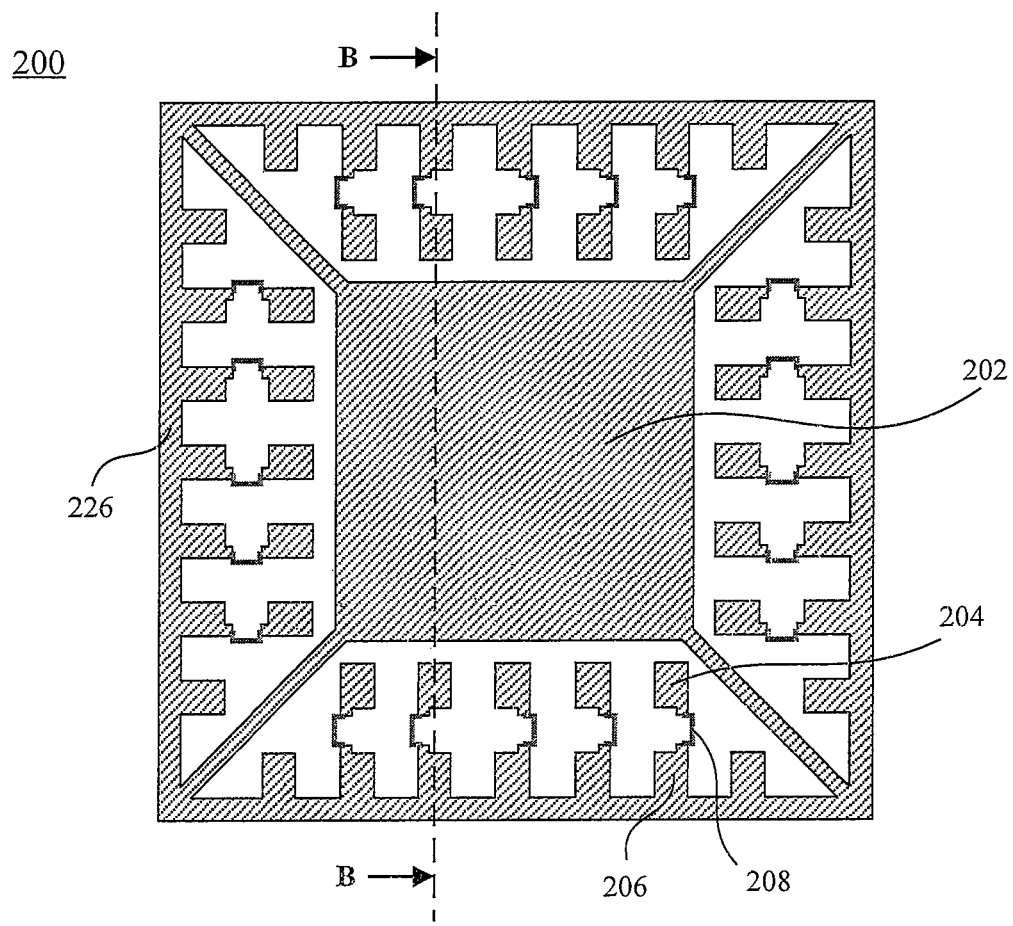
FIG. 11 is a top plan view of the lead frame with vertical connection bars illustrated in FIG. 10.

FIGS. 10 and 11 are respective isometric and top plan views of the lead frame 200 with the connection bars 208 bent to the vertical position in accordance with an embodiment of the present invention. Each connection bar 208 connects one inner row lead 204 to a respective outer row lead 206. Adjacent outer row leads 206 are connected by a dam bar 226. The inner and outer row leads 204 and 206 surrounds the die support area 202.

FIGS. 12-16 are a series of diagrams illustrating the steps in assembling or packaging a semiconductor device with the lead frame 200 that has connection bars 208 bent to the vertical position in accordance with an embodiment of the present invention.

Figure 12:
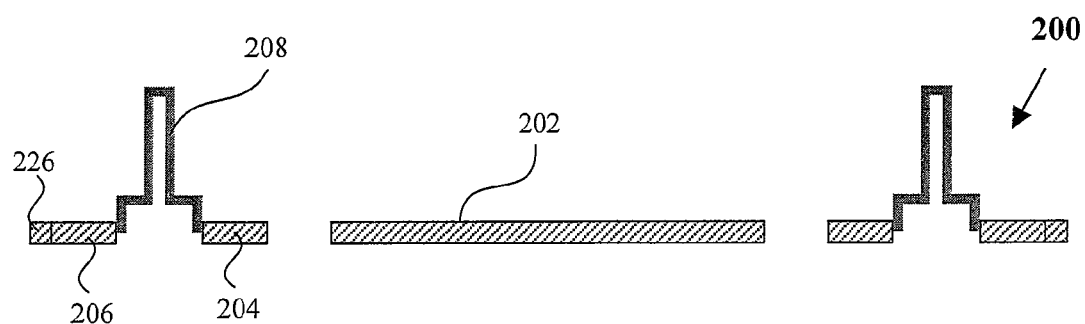
FIGS. 12-16 are a series of diagrams illustrating the steps in packaging a semiconductor device in accordance with an embodiment of the present invention.

Starting from FIG. 12, the lead frame 200 having connection bars 208 bent to the vertical position is provided. FIG. 12 is a cross-sectional view of the lead frame 200 from the line B-B of FIG. 11.

Figure 13:
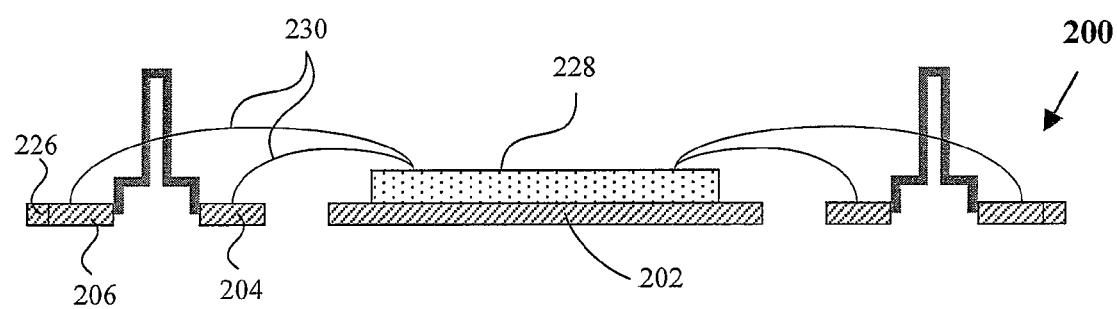
Figure 14:
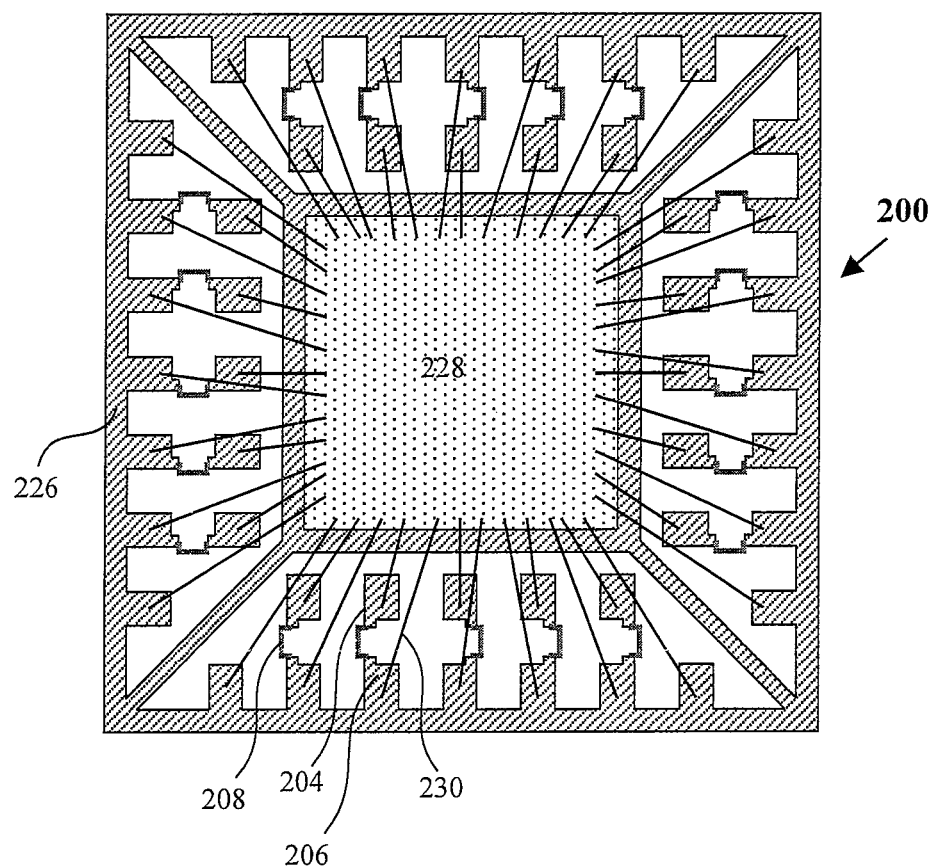

In the next step illustrated in FIG. 13, a semiconductor die 228 is attached to the die support area 202 of the lead frame 200, and electrically connected to the inner and outer row leads 204 and 206 with a plurality of bond wires 230 to form a partially assembled semiconductor device 300. Both die attach and wire bonding are well known steps in semiconductor device assembly so a detailed description of these steps is not necessary for a complete understanding of the invention except to say that the height of the vertical connection bars 208 preferably is greater than the height of wire loops of the bond wires 230. FIG. 14 is a top plan view of the partially assembled semiconductor device 300 shown in FIG. 13. Offsetting each connection bar 208 to one of the two sides of each lead 204 and 206 provides space for bonding the bond wires 230 from the semiconductor die 228 to the outer row leads 206.

Figure 15:
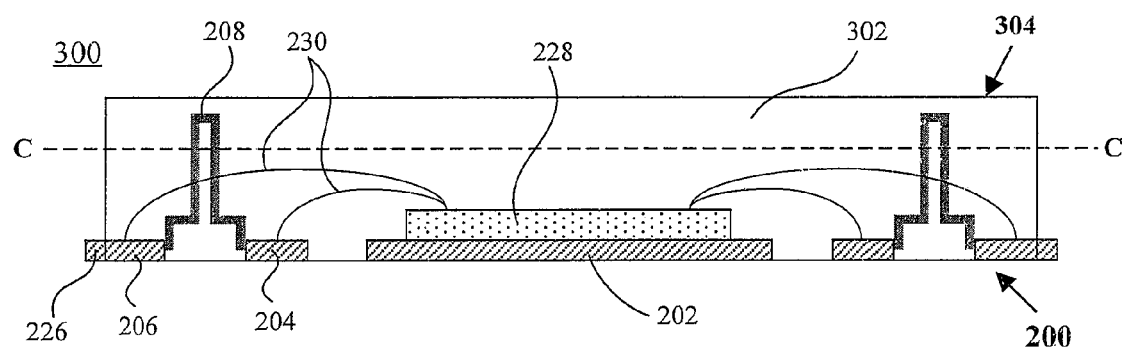

In the next step illustrated in FIG. 15, the semiconductor die 228, the bond wires 230 and the inner and outer row leads 204 and 206 are encapsulated with a molding material 302 to form a molded package body 304. Like die attach and wire bonding, encapsulation also is a well known step in semiconductor device assembly.

Figure 16:
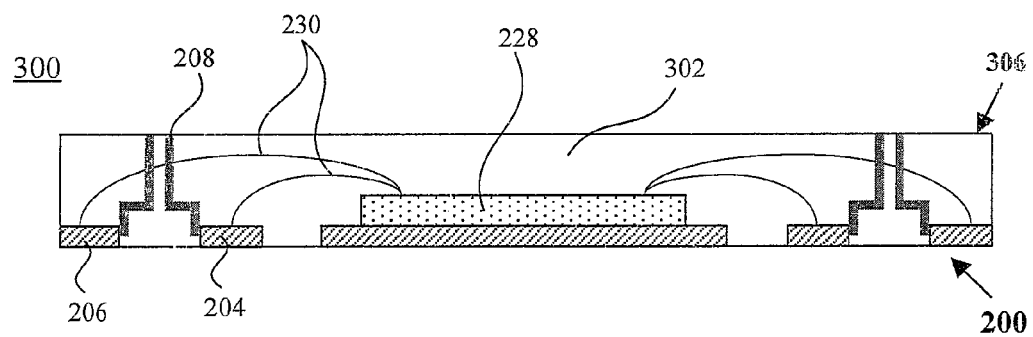

In the next step illustrated in FIG. 16, a top portion of the molded package body 304 is removed along the line C-C of FIG. 15 to cut a top portion of the connection bars 208 such that the inner row leads 204 are no longer connected to the outer row leads 206. In a preferred embodiment, the top portion of the molded package body 304 is removed by a grinding or sawing along the line C-C of FIG. 15. The height of the line C-C of FIG. 15 is between the height of the connection bar 208 and the height of the highest wire loop of the bond wires 230. The dam bar 206 is also removed by cutting or punching process to disconnect adjacent outer row leads 206. In this manner, the semiconductor device 300 is assembled. As shown in FIG. 16 the semiconductor device 300 includes a lead frame 200 having a die support area 202 and at least two rows of leads surrounding the die support area 202, where the two rows of leads include inner row leads 204 and a outer row leads 206. The semiconductor device 300 also includes a semiconductor die 228 mounted on the die support area 202 and electrically connected to the two rows of leads 204 and 206 with bond wires 230, and a molding material 302 encapsulating the semiconductor die 228, the bond wires 230 and the two rows of leads 204 and 206. The molding material defines a package body 306 and the two rows of leads 204 and 206 are exposed on a bottom surface of the package body 306. The semiconductor device 300 further includes inner connection bars 208 connected to the inner row leads 204, where the inner connection bars 208 extend vertically from the inner row leads 204 to a top surface of the package body 306, and where the inner connection bars 208 are connected to respective ones of the outer row leads 206 before the molding material 302 is provided to encapsulate the semiconductor die 228, the bond wires 230 and the two rows of leads 204 and 206.

Figure 17:
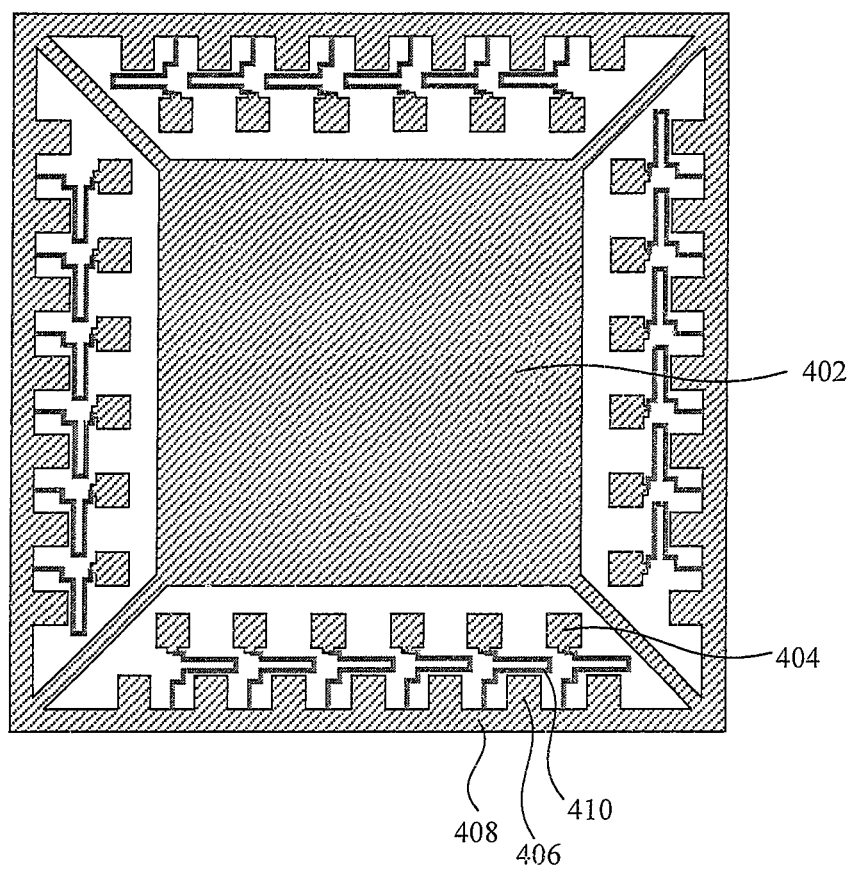
FIG. 17 is a schematic top plan view of a lead frame in accordance with another embodiment of the present invention.

FIG. 17 is a schematic top plan view of a lead frame 400 in accordance with another embodiment of the present invention. The lead frame 400 includes a die support area 402 for supporting a semiconductor die (not shown), at least two rows of leads surrounding the die support area 402, wherein the two rows of leads include a plurality of inner row leads 404 and a plurality of outer row leads 406. The inner row leads 404 and the outer row leads 406 are staggered, and adjacent outer row leads 406 are connected to each other by a dam bar 408. The lead frame 400 further includes a connection bar 410 connecting each of the inner row leads 204 to a respective one of the dams 408, wherein the connection bar 208 is bendable from a horizontal position to a vertical position. The lead frame 400 is preferably formed from a piece of metal sheet, such as copper, by stamping or etching process.

Figure 18:
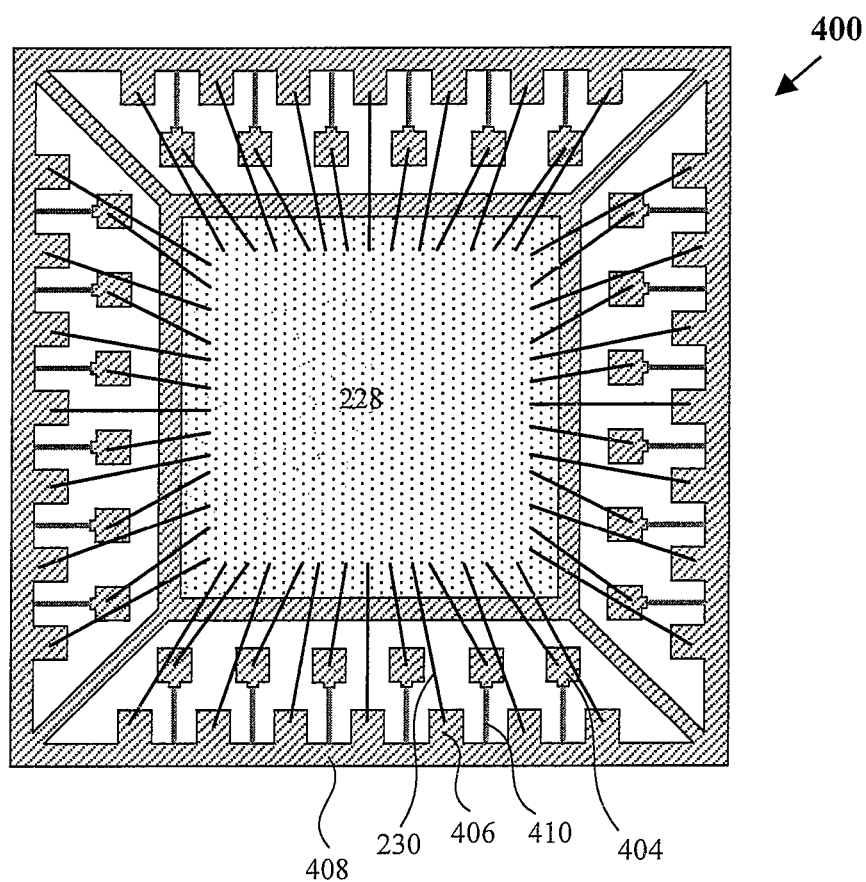
FIG. 18 is a schematic top plan view of a partially assembled semiconductor device in accordance with an embodiment of the present invention.

FIG. 18 is a schematic top plan view of a partially assemble semiconductor device 500 with the lead frame 400 shown in FIG. 17 having connection bars bent to the vertical position. A semiconductor die 228 is attached to the die support area 402 and electrically connected to the inner and outer row leads 404 and 406 with bond wires 230. As illustrated in FIG. 18, staggering the inner row leads 404 with the outer row leads 406 and having connection bars 410 that connect the inner row leads 404 to the dam bars 408 provide space for bonding the bond wires 230 from the semiconductor die 228 to the outer row leads 406.

Figure 19:
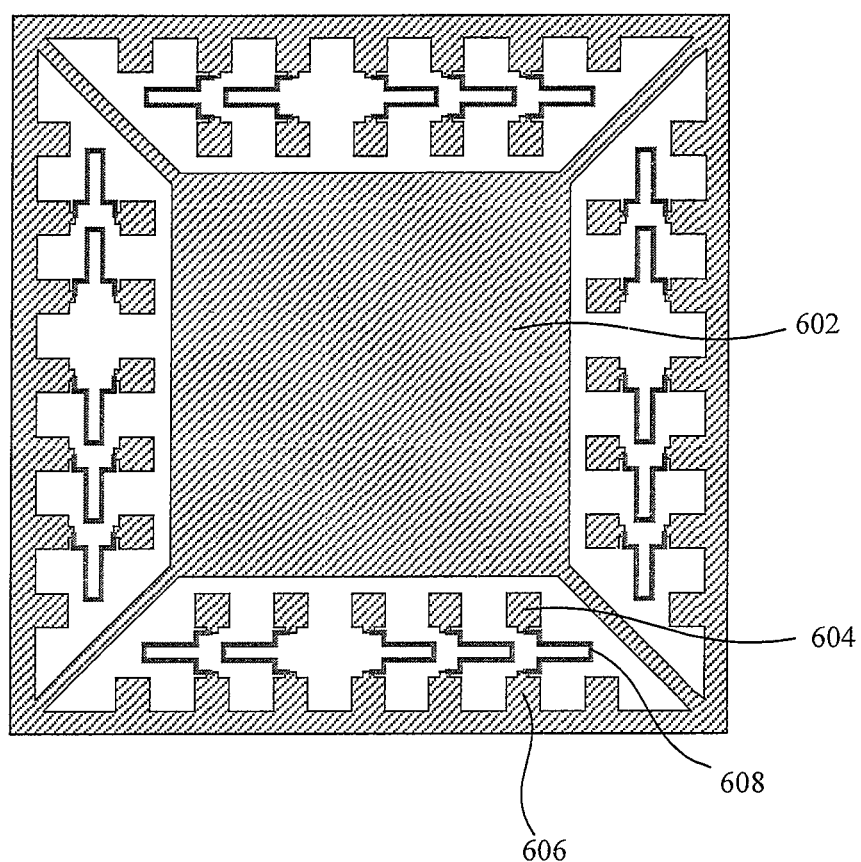
FIG. 19 is a schematic top plan view of a lead frame in accordance with yet another embodiment of the present invention.

FIG. 19 is a schematic top plan view of a lead frame 600 in accordance with yet another embodiment of the present invention. The lead frame 600 includes a die support area 602 for supporting a semiconductor die (not shown), at least two rows of leads surrounding the die support area 602, wherein the two rows of leads include a plurality of inner row leads 604 and a plurality of outer row leads 606. The lead frame 600 further includes a connection bar 608 connecting each of the inner row leads 604 to a respective one of the outer row leads 606, wherein the connection bar 608 is bendable from a horizontal position to a vertical position. The lead frame 600 is preferably formed from a piece of metal sheet by stamping or etching (as are known in the art).

Figure 20:
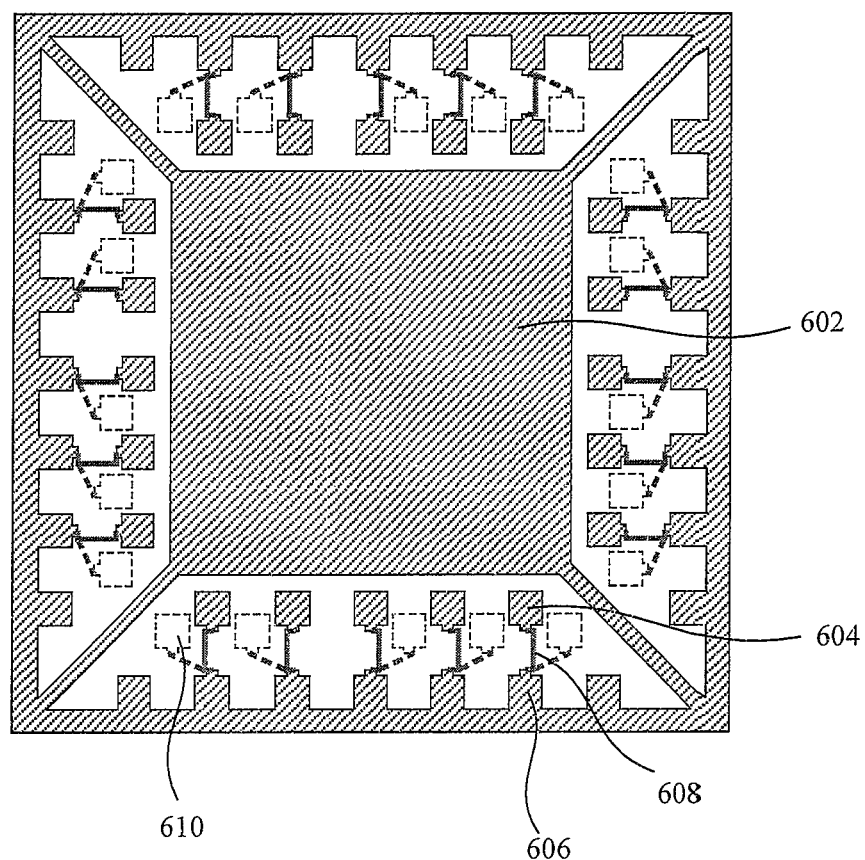
FIG. 20 is a schematic top plan view of the lead frame with vertical connection bars illustrated in FIG. 19.

FIG. 20 is a schematic top plan view of the lead frame 600 with the connection bars 608 bent to the vertical position in accordance with an embodiment of the present invention. After bending the connection bars 608 to the vertical position, and before die attaching and wire bonding processes, the inner row leads 604 are horizontally pushed to a position 610 shown in dotted lines to make the inner row leads 604 staggered with the outer row leads 606.

Figure 21:
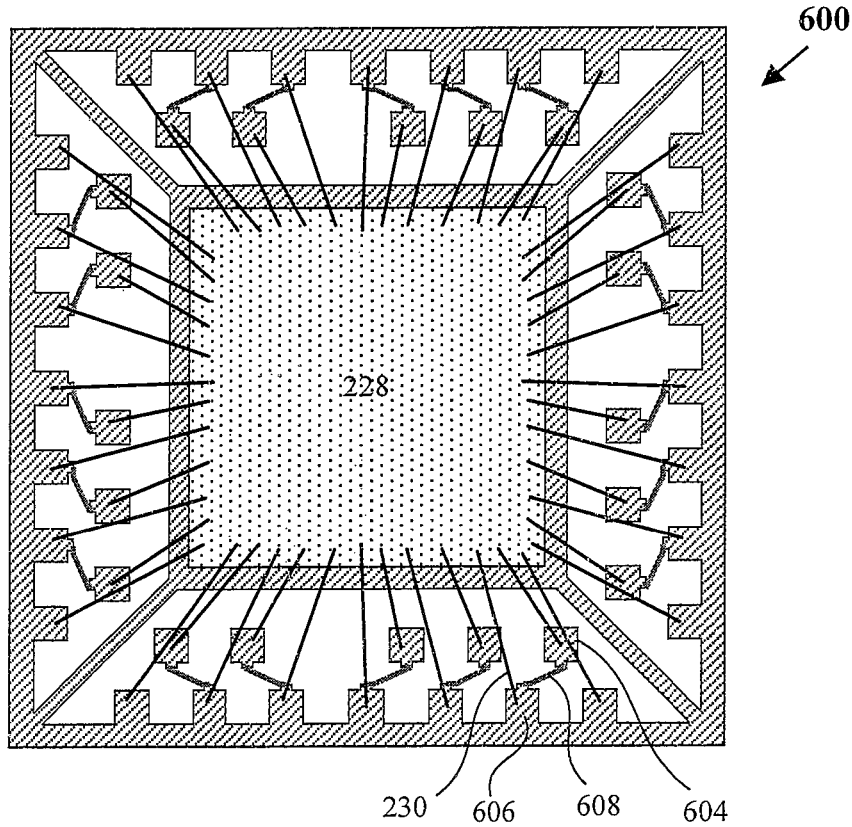
FIG. 21 is a schematic top plan view of a partially assembled semiconductor device in accordance with an embodiment of the present invention.

FIG. 21 is a schematic top plan view of a partially assemble semiconductor device 700 with the lead frame 600 shown in FIG. 20. A semiconductor die 228 is attached to the die support area 602 and electrically connected to the inner and outer row leads 604 and 606 with bond wires 230. As illustrated in FIG. 21, staggering the inner row leads 604 with the outer row leads 606 provides space for bonding the bond wires 230 from the semiconductor die 228 to the outer row leads 606.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device, comprising:
   a lead frame having a die support area and at least two rows of leads surrounding the die support area, wherein the two rows of leads include a plurality of inner row leads and a plurality of outer row leads;
   a semiconductor die mounted on the die support area and electrically connected to the two rows of leads with a plurality of bond wires;
   a molding material encapsulating the semiconductor die, the bond wires and the two rows of leads, wherein the molding material defines a package body and the two rows of leads are exposed on a bottom surface of the package body; and
   inner connection bars connected to the inner row leads, wherein the inner connection bars extend vertically from the inner row leads to a top surface of the package body, wherein the inner connection bars are connected to respective ones of the outer row leads before the molding material is provided to encapsulate the semiconductor die, the bond wires and the two rows of leads, and
   wherein at least one of the outer row leads has an outer connection bar extending vertically to the top surface of the package body, wherein the outer connection bar is connected to at least one of the inner connection bars before the molding material is provided to encapsulate the semiconductor die, the bond wires and the two rows of leads.

2. The semiconductor device of claim 1, wherein each lead comprises a proximal end and an opposing distal end, the inner connection bar of each inner row lead extends from the distal end of each inner row lead, and the outer connection bar of each outer row lead extends from the proximal end of each outer row lead.

3. The semiconductor device of claim 2, wherein each lead further comprises two sides opposite to each other and adjacent to the proximal and distal ends, and wherein each of the inner and outer connection bars is offset to one of the two sides of each lead.

4. The semiconductor device of claim 1, wherein at least one of the inner and outer connection bars extends to the top surface of the package body with an inclination angle that is greater than 90°.

5. The semiconductor device of claim 1, wherein the inner row leads and the outer row leads are staggered.

6. The semiconductor device of claim 5, wherein the outer row leads are connected to each other by a dam bar before molding, wherein the dam bar comprises at least one outer connection bar that extends between two outer row leads for connecting to one of the inner row leads before molding.

7. A lead frame, comprising:
   a die support area for supporting a semiconductor die;
   at least two rows of leads surrounding the die support area, wherein the two rows of leads include a plurality of inner row leads and a plurality of outer row leads;
   a plurality of inner row connection bars respectively connected to each of the inner row leads, wherein the plurality of inner row connection bars is bendable to a vertical position; and
   a plurality of outer row connection bars respectively connected to each of the outer row leads, wherein the plurality of outer row connection bars is bendable to a vertical position, and wherein each of the plurality of outer row connection bars is connected to a respective one of the plurality of inner row connection bars.

8. The lead frame of claim 7, wherein each lead comprises a proximal end and an opposing distal end, and the plurality of inner row and outer row connection bars respectively extend from the distal end of each inner row lead, and the proximal end of each outer row lead.

9. The lead frame of claim 8, wherein each lead further comprises two sides opposite to each other and adjacent to the proximal and distal ends, and the inner row and outer row connection bars are offset to one of the two sides.

10. The lead frame of claim 7, wherein the inner row leads and the outer row leads are staggered.

11. The lead frame of claim 10, further comprising a dam bar connecting adjacent outer row leads, and wherein the inner row and outer row connection bars connect the inner row leads to the dam bar.

\* \* \* \* \*